United States Patent
Tatsumi

(10) Patent No.: US 8,419,892 B2
(45) Date of Patent: Apr. 16, 2013

(54) PLASMA PROCESS DETECTING SENSOR

(75) Inventor: Tomohiko Tatsumi, Miyagi (JP)

(73) Assignee: Lapis Semiconductor Co., Ltd., Tokyo (JP)

( * ) Notice: Subject to any disclaimer, the term of this patent is extended or adjusted under 35 U.S.C. 154(b) by 1133 days.

(21) Appl. No.: 12/219,305

(22) Filed: Jul. 18, 2008

(65) Prior Publication Data

US 2009/0061540 A1    Mar. 5, 2009

(30) Foreign Application Priority Data

Sep. 3, 2007 (JP) ................. 2007-227396

(51) Int. Cl.
  *C23F 1/00* (2006.01)
  *H01L 21/306* (2006.01)
(52) U.S. Cl.
  USPC ................ 156/345.28; 156/345.24
(58) Field of Classification Search ............ 156/345.28, 156/345.24; 216/18, 61, 79; 257/48; 438/9, 438/10, 14, 706, 710
  See application file for complete search history.

(56) References Cited

U.S. PATENT DOCUMENTS

| 7,184,134 B2 | 2/2007 | Samukawa et al. |
| 2005/0011611 A1* | 1/2005 | Mahoney et al. ........ 156/345.24 |
| 2005/0115673 A1 | 6/2005 | Samukawa et al. |

FOREIGN PATENT DOCUMENTS

| JP | 2003-282546 | 10/2003 |
| JP | 2005-236199 | 9/2005 |

* cited by examiner

*Primary Examiner* — Rakesh Dhingra
(74) *Attorney, Agent, or Firm* — Rabin & Berdo, P.C.

(57) ABSTRACT

The present invention provides a plasma process detecting sensor. In the plasma process detecting sensor, a hole diameter of an insulating film is spread with almost no spread of a hole diameter of an upper electrode. Therefore, when the plasma process detecting sensor is exposed to a plasma, positive ions incident onto the bottom of a contact hole are hard to collide with an inner wall surface of a hole main body of the insulating film. As a result, the inner wall surface of the hole main body of the insulating film is hard to undergo damage, and the generation of a defect level that assists electric conduction can be suppressed. It is thus possible to suppress age deterioration of a sensor function during the measurement of a charge-up under an environment of a plasma etching condition.

7 Claims, 10 Drawing Sheets

PLASMA PROCESS DETECTING SENSOR

BACKGROUND OF THE INVENTION

The present invention relates to a plasma process detecting sensor which monitors a physical phenomenon of a plasma state developed by plasma etching of a dry etching process corresponding to part of a semiconductor manufacturing process, and a manufacturing method of the plasma process detecting sensor, and further relates to a method for manufacturing a semiconductor device, using the plasma process detecting sensor.

As techniques each related to a plasma monitoring system using a plasma process detecting sensor for monitoring the process of treating a wafer disposed within a plasma processing apparatus, there have heretofore been known ones described in patent documents 1 and 2 (Japanese Unexamined Patent Publication No. 2003-282546 and Japanese Unexamined Patent Publication No. 2005-236199).

The conventional plasma process monitoring system described in each of the patent documents 1 and 2 is provided with a plasma processing apparatus. The plasma processing apparatus is of an apparatus that generates a plasma within a plasma chamber set to a vacuum state by application of a high-frequency (hereinafter called "RF") bias and performing etching and deposition or growth on a wafer corresponding to an object to be monitored placed on a stage. A plasma process detecting sensor is attached or affixed onto the wafer.

When the monitoring of a plasma process is performed, a plasma occurs in the plasma chamber by application of the RF bias and a plasma process (e.g., plasma etching process) is performed on the wafer. Upon the plasma etching process, etching occurs by launching positive ions (positive holes) h and electrons e generated by the plasma into a film to be etched. At this time, the time of completion of the plasma etching can be detected by observing a voltage value detected by the plasma process detecting sensor, whereby high-precision machining of the wafer is enabled.

The plasma monitoring system using the conventional plasma process detecting sensor however involves the following problems or imperfections.

Upon processing for forming a large-scale integration (hereinafter called "LSI") on a wafer, for example, a plurality of contact holes are formed by plasma etching. Since, however, both a potential at the surface of the wafer and a potential at the bottom of each contact hole cannot be monitored in the prior art, charge polarization (charge-up) due to the storage of an electric charge cannot be measured. When an aspect ratio (ratio of a depth of contact hole to the diameter thereof) is high, electrons e are hard to reach the bottom of the contact hole (electron blocking effect). Therefore, the bottom of each contact hole falls short of the supply of the electrons e. As compared with the surface of a contact hole pattern, the contact hole bottom is charged up to plus. These cause problems such as an electrical breakdown of a transistor, a reduction in etching rate, non-progression of etching, etc. Since a contact hole diameter in a leading-edge 65 nm generation or latter is $\phi 0.1$ μm and an aspect ratio is as large as 10, the charge-up becomes a serious problem.

In order to solve such imperfections, the inventors, et al. of the present application have previously made such a proposal as shown in FIG. 5 (this previous proposal is not publicly known).

FIG. 5 is a schematic sectional view showing a plasma process detecting sensor previously proposed by the inventors, et al. of the present application.

The plasma process detecting sensor 10 measures the states of electrons e and positive ions h generated by a plasma 21 and has a substrate (e.g., silicon substrate) 11. An insulating film 12 such as a silicon oxide film is formed on the silicon substrate 11. A first electrode (e.g., a lower electrode) 13 comprised of a conductive material such as polysilicon is selectively formed on the insulating film 12. An insulating film 15 comprised of a silicon oxide film or the like is deposited on the first electrode 13. A second electrode (e.g., an upper electrode) 15 comprised of a conductive material such as polysilicon is selectively formed on the insulating film 14.

A contact hole pattern comprised of a plurality of contact holes 16 circular in cross section, which are formed in a wafer actually are formed in the upper electrode 15 by dry etching (e.g., plasma etching). In each of the contact holes 16, for example, a hole diameter (bore diameter) D1 circular in section is about 100 nm, and a hole depth D2 has a length that extends from the surface of the upper electrode 15 to the surface of the lower electrode 13 and is about 1.3 μm. A wiring connecting area 17 is made open at an exposed spot of the surface of the insulating film 14 and the surface of the lower electrode 13 is hence exposed. A voltage measuring device 20 for potential difference measurement is connected between the upper electrode 15 and the lower electrode 13 via wirings 18 and 19.

As mentioned above, the contact hole diameter in the leading-edge 65 nm generation or later is $\phi 0.1$ μm and the aspect ratio is as large as 10. Upon the formation of such contact holes 16, it is difficult to obtain a vertical shape even though the plasma etching technology is used. The contact hole becomes easy to tend to assume a forward taper (the diameter of the lower portion of the contact hole 16 is smaller than that of the upper portion thereof). It is also difficult to bring the contact hole to an inversely-tapered shape by plasma etching. In a plasma etching process step, positive ions h and electrons e are launched into a film to be etched thereby to cause etching. The positive ions h and the electrons e are identical in the amount of incidence. Since, however, the electrons e are larger than the positive ions h in transverse momentum, the electrons e do not enter vertically so much as compared with the positive ions h where the ratio of the depth D2 of each contact hole 16 to the diameter D1 thereof is large. Therefore, some electrons e which collide with an inner wall surface of the contact hole 16 and cannot reach the contact hole bottom, exist in the electrons e migrated to the bottom of each contact hole.

On the other hand, the positive ions h reach the bottom of each contact hole 16 without colliding with the inner wall surface of the contact hole 16 so much as compared with the electrons e. Therefore, the positive ions h rather than the electrons e are much stored at the contact hole bottom. Since the electrons e are much deposited at the upper portion of the contact hole 16, charge polarization, i.e., charge-ups occur at the upper and lower portions of the contact hole 16. The occurrence of the charge-ups leads to the problems such as the reduction in etching rate, the stop of etching as described above.

A method of quantitatively measuring a charge-up using the plasma process detecting sensor 10 shown in FIG. 5 will next be explained.

When the sensor 10 is exposed to the plasma 21 corresponding to an environment for a plasma etching condition, the upper electrode 15 become negatively charged and the contact hole bottom, i.e., the lower electrode 13 becomes positively charged, whereby a charge-up occurs. The degree of this charge polarization (charge-up amount) is measured by the voltage measuring device 20 as a difference in potential between the upper electrode 15 and the lower electrode 13, and hence the charge-up amount for the plasma etching condition can be measured quantitatively.

Although, however, the previous proposal of the inventors, et al. of the present application can solve the problems or imperfections of the related arts, there is a possibility that such a problem as shown in FIG. 6 will occur.

FIG. 6 is a view for describing damage to the inner wall surface of the contact hole 16 due to the positive ions h shown in FIG. 5.

When the sensor 10 is exposed to a plasma etching environment, a small part of the positive ions h collides with the inner wall surface of the contact hole of the insulating film 14 that assumes the forward tapered shape. Therefore, the inner wall surface of the contact hole formed in the insulating film 14 undergoes physical damage due to the collision. The physical damage is specifically a defect in the insulating film 14 and has a defect level that assists electric conduction to the electrons e. Namely, as the defect level due to the collision of the positive ions h increases, the resistance of the inner wall surface of the contact hole formed in the insulating film 14 is reduced, so that the current (electrons) become easy to flow. In doing so, the electrons e stored with being polarized to the upper electrode 15 migrate from the upper electrode 15 to the lower electrode 13 via the defect level thereby to cancel out the positive ions h deposited with being polarized to the lower electrode 13. Therefore, the degree of charge polarization becomes small (charge-up amount is reduced) and the difference in potential between the upper electrode 15 and the lower electrode 13 is reduced. Namely, as the time to expose the sensor 10 to the plasma etching condition becomes longer, there is a possibility that it will not be possible to measure the difference in potential, and there is a possibility of occurrence of a problem that age deterioration of a sensor function will take place during the measurement of a charge-up.

SUMMARY OF THE INVENTION

With the foregoing in view, the present invention aims to solve a problem such as the occurrence of age deterioration of a sensor function during the measurement of a charge-up.

According to one aspect of the present invention, for attaining the above object, there is provided a plasma process detecting sensor comprising a substrate, a first electrode selectively formed over the substrate in a state of being insulated from the substrate, an insulating film deposited over the first electrode, a second electrode selectively formed over a surface of the insulating film and exposed to a plasma during plasma etching, an opening formed in the second electrode, a contact hole defined in the insulating film and having a depth extending from the opening to a surface of the first electrode with a diameter larger than the opening, and a measuring device for measuring a difference in potential between the first and second electrodes during the plasma etching.

According to another aspect of the present invention, for attaining the above object, there is provided a method for manufacturing a plasma process detecting sensor, comprising the steps of selectively forming a first electrode over a substrate in a state of being insulated from the substrate, depositing an insulating film over the first electrode, selectively forming a second electrode exposed to a plasma during plasma etching over a surface of the insulating film, chipping away the second electrode and the insulating film to a depth extending from a surface of the second electrode to a surface of the first electrode by dry etching thereby to form a contact hole, chipping away an inner wall surface of the contact hole formed in the insulating film by wet etching thereby to enlarge a diameter thereof, and connecting a measuring device for measuring a difference in potential between the first and second electrodes to the first and second electrodes.

According to a further aspect of the present invention, for attaining the above object, there is provided a method for manufacturing a semiconductor device, comprising the steps of providing the above plasma process detecting sensor over a surface of a processed substrate or in the neighborhood of the processed substrate, and applying a plasma onto the surface of the processed substrate and a surface of the plasma process detecting sensor and performing a plasma etching process on the processed substrate while controlling a state of processing of plasma etching, based on the result of measurement by the plasma process detecting sensor, thereby manufacturing the semiconductor device.

In the plasma process detecting sensor of the present invention, the diameter of each contact hole formed in the insulating film between the first and second electrodes is spread without spreading the diameter of the opening formed in the second electrode. It is therefore possible to suppress age deterioration of a sensor function during the measurement of a charge-up under an environment of a plasma etching condition.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

A plasma process detecting sensor includes a substrate, a first electrode selectively formed over the substrate in a state of being insulated from the substrate, an insulating film deposited over the first electrode, a second electrode selectively formed over a surface of the insulating film and exposed to a plasma during plasma etching, an opening formed in the second electrode, a contact hole defined in the insulating film and having a depth extending from the opening to a surface of the first electrode with a diameter larger than the opening, and a measuring device for measuring a difference in potential between the first and second electrodes during the plasma etching.

Preferred embodiments of the present invention will hereinafter be described with reference to the accompanying drawings.

First Preferred Embodiment

Configuration of Sensor According to First Preferred Embodiment

Figure 1:
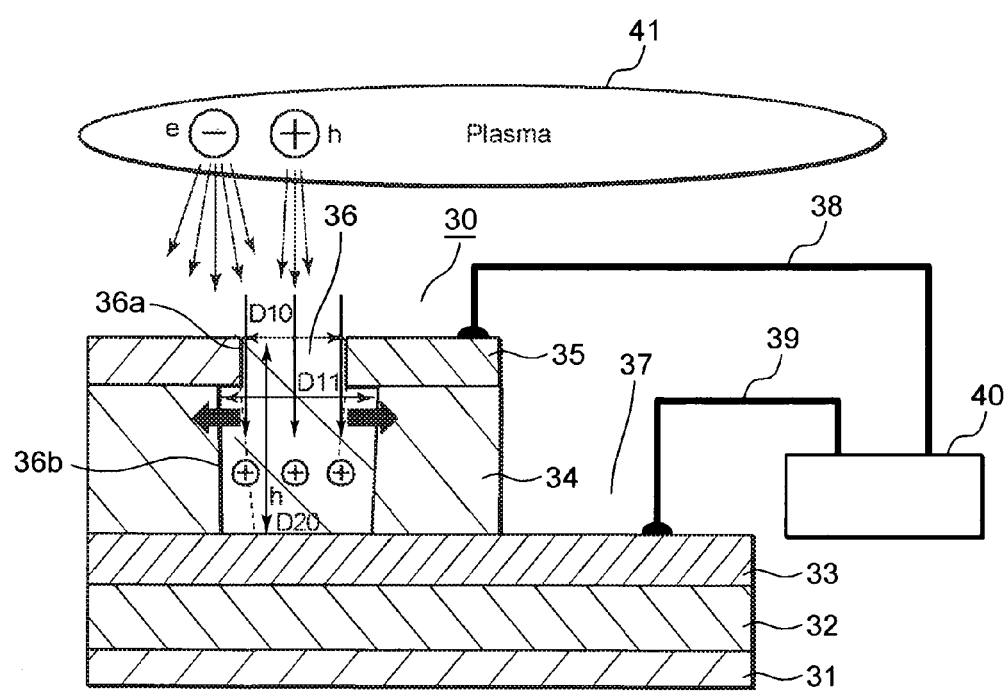
FIG. 1 is a schematic sectional view of a plasma process detecting sensor showing a first preferred embodiment of the present invention.

FIG. 1 is a schematic sectional view of a plasma process detecting sensor showing the first preferred embodiment of the present invention.

The plasma process detecting sensor 30 measures the states of electrons e and positive ions h generated by a plasma 41 and has a substrate (e.g., silicon substrate) 31. An insulating film 32 comprised of a silicon oxide film (SiO2 film) of an about 1.0 µm-thick or the like is formed on the silicon substrate 31. A first electrode (e.g., lower electrode) 33 comprised of a conductive substance such as polysilicon (Poly-Si), of an about 300 nm-thick is selectively formed on the insulating film 32. An insulating film 34 comprised of a silicon oxide film of an about 1.0 µm-thick or the like is deposited on the first electrode 33. A second electrode (e.g., upper electrode) 35 comprised of a conductive substance such as polysilicon, of an about 300 nm-thick is selectively formed on the insulating film 34.

A contact hole pattern comprising a plurality of contact holes 36 circular in cross section, which are formed in a wafer used as a processed substrate of a semiconductor device, are actually formed in the upper electrode 35. Each of the contact holes 36 is comprised of an aperture or opening 36a circular in section, having a hole diameter D10 (e.g., about 10 nm), which is formed in the upper electrode 35, and a hole main body 36b circular in section, which is defined in the insulating film 34 and has a hole diameter D11 larger than the opening 36a. The contact hole 36 has a hole depth D20 (e.g., about 1.3 µm) having a length that extends from the surface of the upper electrode 35 to the surface of the lower electrode 33. The contact hole 36 has such a hole structure that the contact hole 36 having the hole diameter D10 and hole depth D20, which extends from the surface of the upper electrode 35 to the surface of the lower electrode 33, is formed by dry etching (e.g., plasma etching) and thereafter the hole diameter D11 of the hole main body 36b formed in the insulating film 34 is spread as indicated by arrows in FIG. 1 by wet etching using an etchant with almost no spread of the hole diameter D10 of the opening 36a formed in the upper electrode 35.

A wiring connecting area 37 is opened at an exposed spot of the surface of the insulating film 34. Hence, the surface of the lower electrode 33 is exposed. Wirings 38 and 39 are respectively connected to the upper electrode 35 and the lower electrode 33. These wirings 38 and 39 are led out to the outside of a plasma chamber via unillustrated terminals. A measuring instrument or device (e.g., voltage measuring device) 40 for measuring a difference in potential between the upper electrode 35 and the lower electrode 33 during plasma etching is connected to the wirings 38 and 39 led out to the outside.

Manufacturing Method of Sensor According to the First Preferred Embodiment

FIGS. 2A~2J are respectively schematic section process views showing an example of a method for manufacturing the plasma process detecting sensor 30 shown in FIG. 1.

In an insulating film forming step (FIG. 2A), an insulating film 32 comprised of a silicon oxide film of an about 1.0 µm-thick is formed on a silicon substrate 31 by a thermal oxidation process. In a conductive film forming step (FIG. 2B), a conductive film 33a comprised of a polysilicon film of an about 300 nm-thick, having a predetermined impurity ion concentration is formed on the insulating film 32 by a chemical vapor deposition method (hereinafter called "CVD method"). In an electrode forming step (FIG. 2C), a mask for an electrode pattern comprised of a resist film is formed on the conductive film 33a by photolithography technology. Next, the conductive film 33a is etched by dry etching technology such as plasma etching to form a lower electrode 33, after which the mask no longer required is ashed and removed.

Figure 2A:
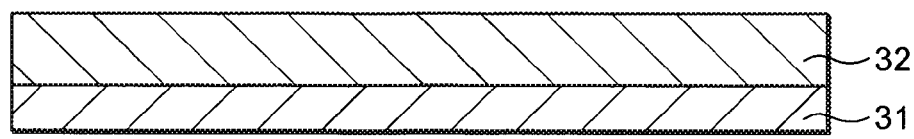
FIG. 2A–2J are a schematic section process view illustrating an example of a method for manufacturing the plasma process detecting sensor 30 shown in FIG. 1.
Figure 2B:
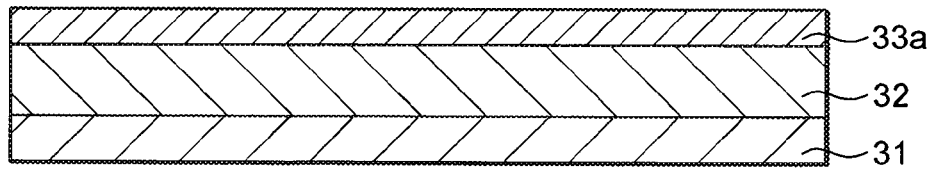
Figure 2C:
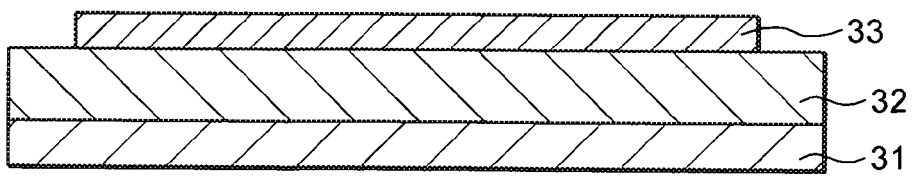
Figure 2D:
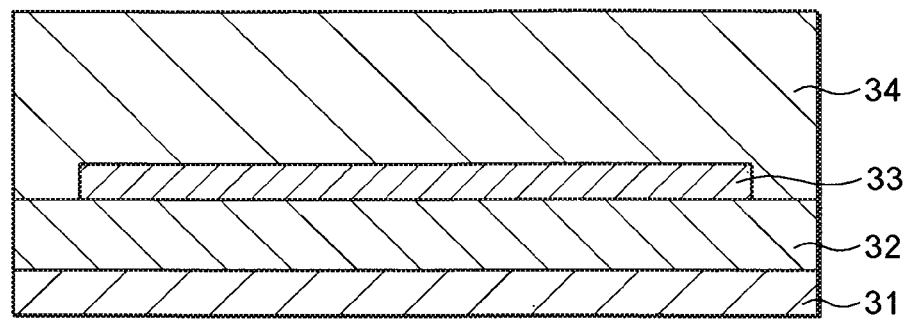
Figure 2E:
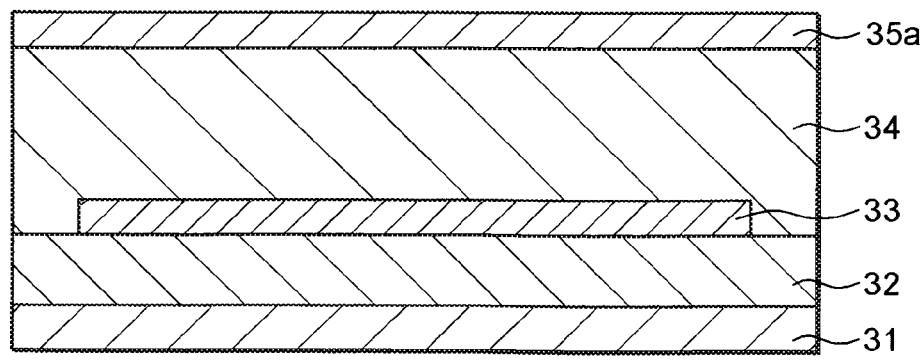
Figure 2F:
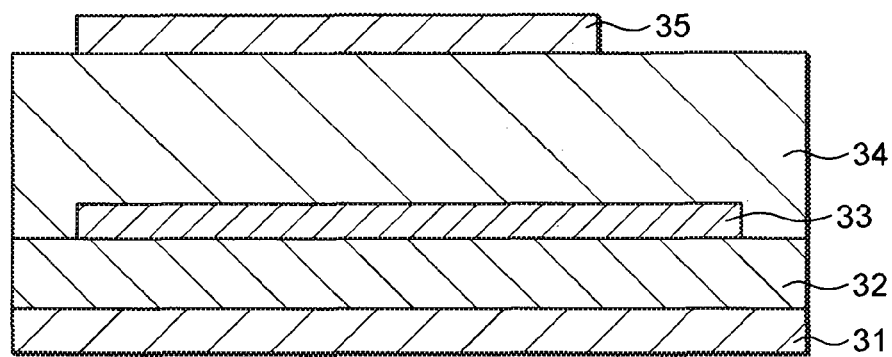
Figure 2G:
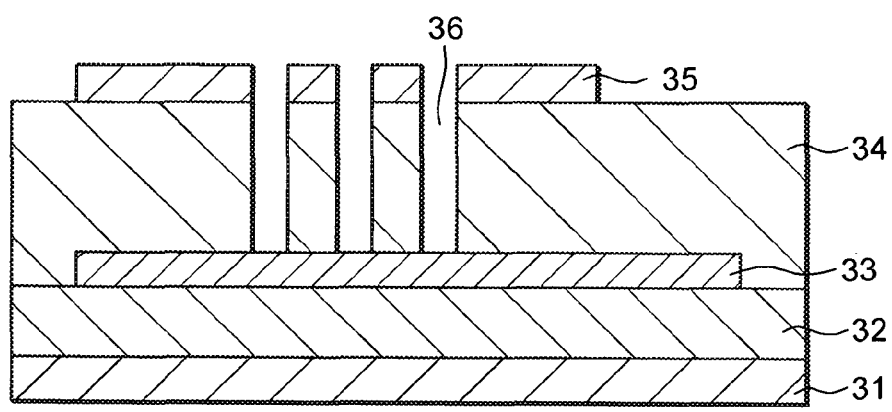
Figure 2H:
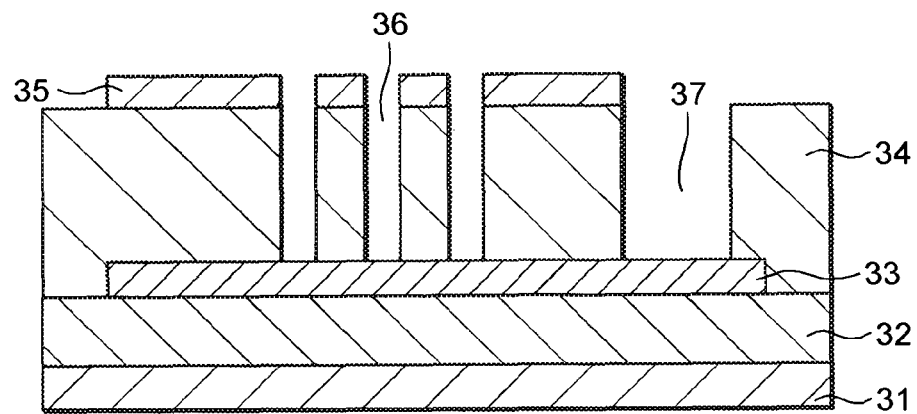

In an insulating film forming step (FIG. 2D), an insulating film 34 comprised of a silicon oxide film of an about 1.0 µm is deposited by the CVD method. In a conductive film forming step (FIG. 2E), a conductive film 35a comprised of a polysilicon film of an about 300 nm-thick, having a predetermined impurity ion concentration is formed on the insulating film 34 by the CVD method in a manner similar to the step (FIG. 2B). In an electrode forming step (FIG. 2F), a mask for an electrode pattern comprised of a resist film is formed on the conductive film 35a by photolithography technology in a manner similar to the step (FIG. 2C). The conductive film 35a is etched by dry etching technology such as plasma etching to form an upper electrode 35.

In a contact hole forming step (FIG. 2G), a resist pattern is formed on the upper electrode 35 by photolithography technology. Thereafter, the upper electrode 35 and the insulating film 34 are etched to a depth that reaches the surface of the lower electrode 33 by dry etching technology (e.g., plasma etching) with the resist pattern as a mask, thereby forming a contact hole pattern comprised of a plurality of contact holes 36 circular in cross section. A hold diameter D10 of each contact hole 36 is about 100 nm and its hole depth D20 is about 1.3 µm. In a wiring connecting area opening or defining step (FIG. 2H), etching is done from the exposed surface of the insulating film 34 to the surface of the lower electrode 33 by photolithography technology and dry etching technology thereby to open a wiring connecting area 37.

Figure 2I:
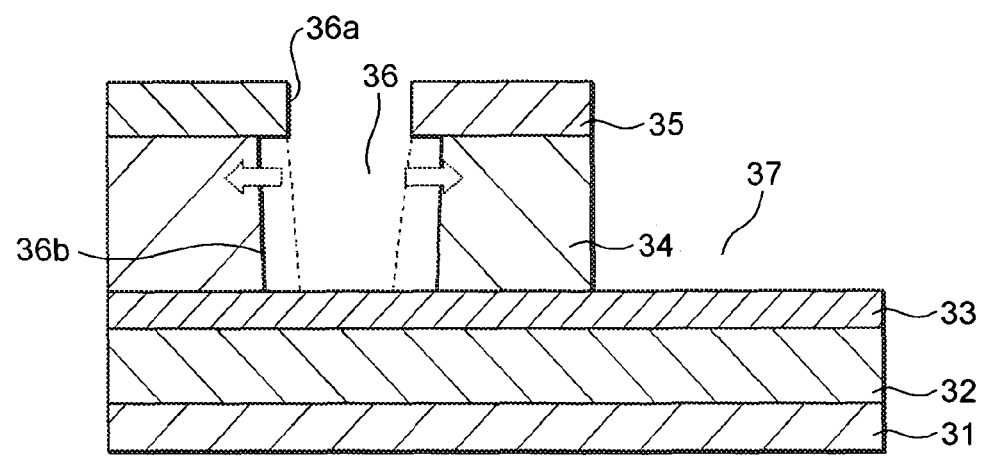
Figure 2J:
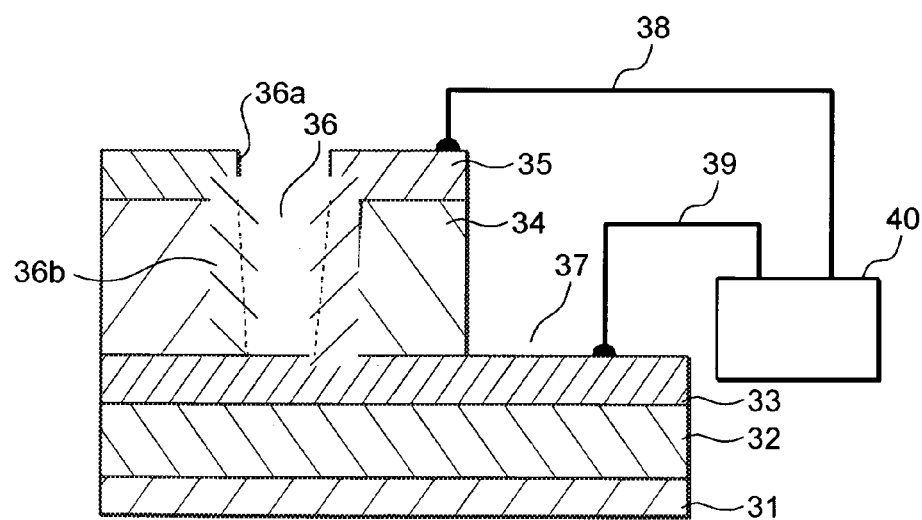

In a contact hole diameter enlarging step (FIG. 2I), an inner wall surface of a hole main body 36b formed in the insulating film 34 is chipped away by wet etching technology using an etchant such as a diluted solution of hydrofluoric acid (Dirac-Hartree-Fock: DHF) or the like with the upper electrode 35 having an opening 36a as a mask. Thus, a hole diameter D11 of the hole main body 36b formed in the insulating film 34 is spread with almost no spread of the hole diameter D10 of the opening 36a formed in the insulating film 34 as indicated by arrows in the step (FIG. 2I)

Thereafter, in a wiring connecting step (FIG. 2J), wirings 38 and 39 are respectively connected to the upper electrode 35 and the lower electrode 33 and connected to the voltage measuring device 40 provided outside the unillustrated plasma chamber.

Operation of Sensor According to First Preferred Embodiment

In FIG. 1, the plasma process detecting sensor 30 is installed in the plasma chamber provided in an unillustrated plasma processing apparatus. An RF bias is applied to the plasma processing apparatus to generate a plasma 41 within the plasma chamber, thereby forming a plasma etching condition. When the plasma process detecting sensor 30 is exposed to the plasma etching condition (plasma 41), electrons e and positive ions h identical in amount are drifted toward the surface of the plasma process detecting sensor.

Since, at this time, the electrons e do no enter vertically so much as compared with the positive ions h, some of the electrons e, which are migrated to the bottom of the contact hole 36, collide with the inner wall surface of the contact hole 36 and cannot reach the bottom of the contact hole 36.

In contrast, the positive ions h are easy to enter vertically as compared with the electrons e. Since the hole diameter D11 of the hole main body 36 formed in the insulating film 34 has been spread by wet etching, the opening 36a of the upper electrode 35 serves as a pentroof and hence the positive ions h are hard to collide with the inner wall surface of the hole main body of the insulating film 34. Therefore, the positive ions h are much deposited on the lower electrode 33. On the other hand, the electrons e are much stored on the upper electrode 35. Thus, a charge-up indicative of charge polarization occurs between the upper electrode 35 and the lower electrode 33 and the degree of polarization of an electric charge with respect to the plasma etching condition (charge-up amount) can be measured as a difference in potential between the electrodes by the voltage measuring device 40.

Figure 3:
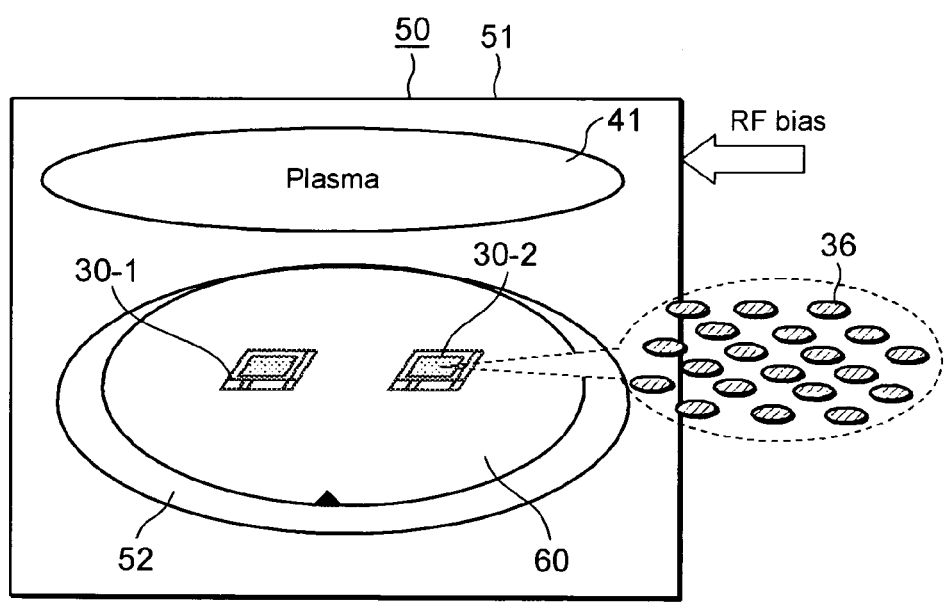
FIG. 3 is a schematic configuration view showing a plasma processing apparatus used in the manufacture of a semiconductor device according to the first preferred embodiment of the present invention.

Manufacturing Method of Semiconductor Device Using Sensor According to First Preferred Embodiment FIG. 3 is a schematic configuration view showing a plasma processing apparatus used in the manufacture of a semiconductor device according to the first preferred embodiment of the present invention.

The plasma processing apparatus 50 is of an apparatus which generates a plasma 41 within a plasma chamber 51 set to a vacuum state by application of an RF bias and performs etching and deposition or growth on a processed substrate (e.g., a wafer such as a semiconductor wafer) 60 placed on a stage 52.

When the wafer 60 is processed to manufacture each semiconductor device, a plurality of (two) plasma process detecting sensors 30 (=30-1 and 30-2) are affixed or attached onto different spots lying within the surface of the wafer 60. The wafer 60 with the sensors attached thereto is placed on the stage 52 lying within the plasma chamber 51. Next, for example, the pressure within the plasma chamber 51 is set to 120 mTorr and a mixed gas of CHF3, CF4, N2 and Ar is charged therein as a filler gas. An RF bias of 1600 W is applied to the plasma processing apparatus 50 to generate a plasma 41 within the plasma chamber 51, after which the wafer 60 is exposed to the plasma 41.

In doing so, the surface of the wafer 60 is chipped away by plasma etching using the plasma 41. At this time, a charge-up occurs at the bottom of each of contact holes 36 lying within the sensors 30 (=30-1 and 30-2). Namely, charge polarization takes place between the surface of a contact hole pattern and the bottom of each contact hole 36. With its polarization, different potentials occur at an upper electrode 35 and a lower electrode 33. Therefore, if the difference in potential between the upper electrode 35 and the lower electrode 33 is measured by the corresponding voltage measuring device 40 and the charge-up is monitored, then the time of completion of the plasma etching and the like can be detected. Thus, if the state of processing of the plasma etching is controlled based on the result of measurement by the voltage measuring device 40, then high-precision processing or machining of the wafer 60 is enabled. If necessary processing is performed on the wafer 60 in addition to above, then a desired semiconductor device can be manufactured.

Incidentally, the number of the sensors 30 attached onto the wafer 60 may be optional. The sensors 30 may be placed in the neighborhood (for example, in the stage 52 or near the stage 52) of the wafer 60.

Effects of First Preferred Embodiment)

According to the first preferred embodiment, the following effects of (a) and (b) are brought about.

(a) According to the sensor 30 shown in FIG. 1, the hole diameter D11 of the insulating film 34 is spread by wet etching with almost no spread of the hole diameter D10 of the upper electrode 35. Therefore, the positive ions h incident on the bottom of the contact hole becomes hard to collide with the inner wall surface of the hole main body of the insulating film 34. Consequently, the inner wall surface of the hole main body of the insulating film 34 is hard to undergo damage, and the generation of a defect level that assists electric conduction can be suppressed. Thus, it is possible to suppress age deterioration of a sensor function during the measurement of a charge-up under an environment of the plasma etching condition.

(b) When a semiconductor device is fabricated using the sensor 30 shown in FIG. 1, high-precision machining of the wafer 60 is enabled because the state of processing of plasma etching is controlled based on the result of measurement by the voltage measuring device 40.

Second Preferred Embodiment

Figure 4:
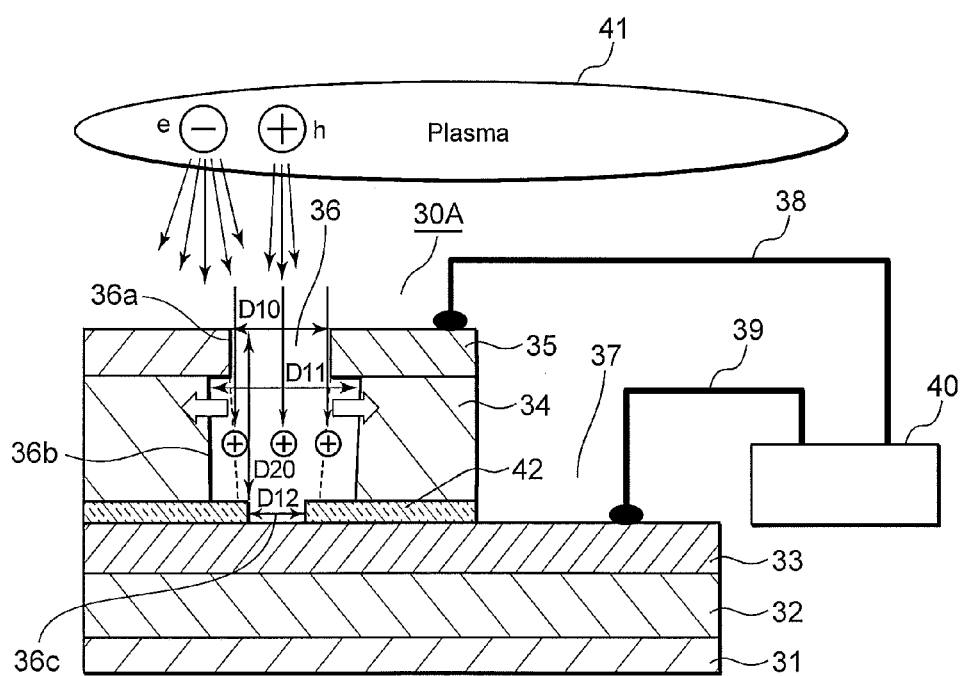
FIG. 4 is a schematic sectional view of a plasma process detecting sensor showing a second preferred embodiment of the present invention.
Figure 5:
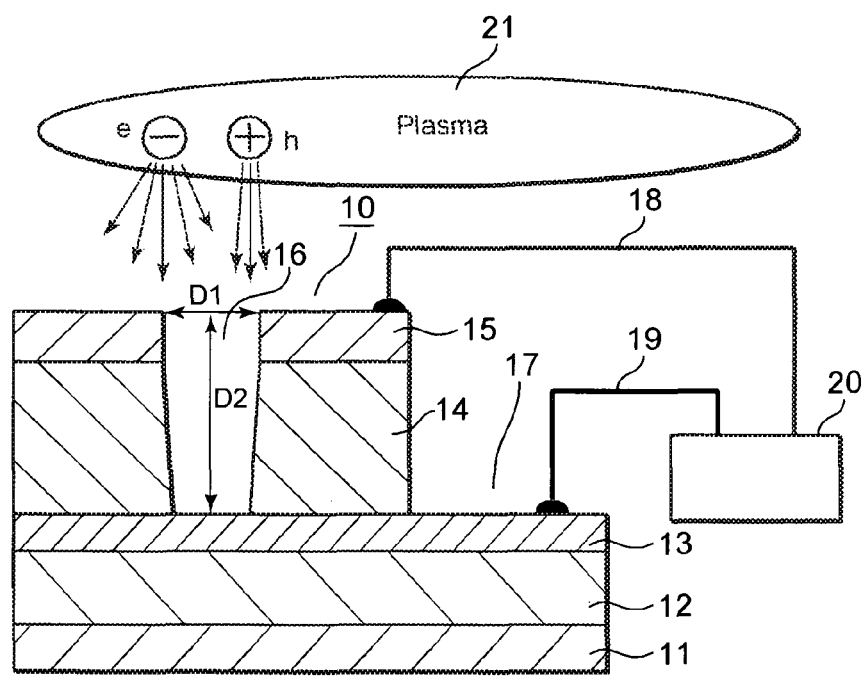
FIG. 5 is a schematic sectional view illustrating a previously-proposed plasma process detecting sensor.
Figure 6:
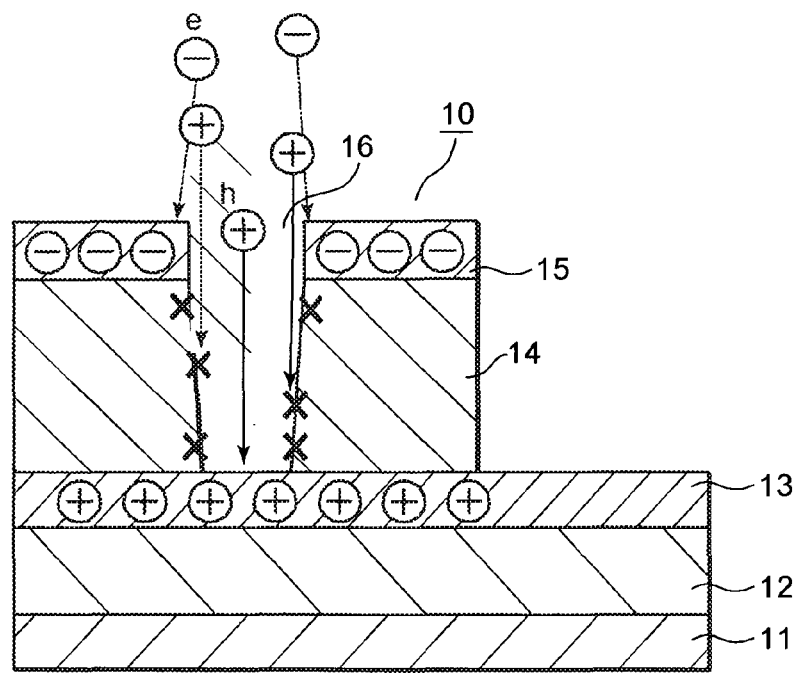
FIG. 6 is a view for describing damage at an inner wall surface of a contact hole 16 due to positive ions h shown in FIG. 5.

Configuration/Manufacturing Method of Sensor Showing Second Preferred Embodiment FIG. 4 is a schematic sectional view of a plasma process detecting sensor showing a second preferred embodiment of the present invention. Common reference numerals are attached to elements used in common with the elements shown in FIG. 1 illustrating the first preferred embodiment.

In the plasma process detecting sensor 30A of the present embodiment, a plurality of types (e.g., two types) of first and second insulating films 42 and 34 are stacked between a lower electrode 33 and an upper electrode 35. The first insulating film 42 is thinner than the second insulating film 34 in thickness (e.g., by about $1/10$) and formed of a silicon nitride film or the like larger in etching resistance than the second insulating film 34. The second insulating film 34 is formed of a silicon oxide film or the like in a manner similar to the first preferred embodiment.

A contact hole pattern comprised of contact holes 36 circular in cross section is formed in the upper electrode 35 in a manner substantially similar to the first preferred embodiment. Each of the contact holes 36 has a first opening 36a circular in section, which is formed in the upper electrode 35 and has a hole diameter D10 (e.g., about 100 nm), a hole main body 36b circular in section, which is defined in the insulating film 34 and has a hole diameter D11 larger than the opening 36a, and a second opening 36c circular in section, which is formed in the insulating film 42 and has a hole diameter D12 (<D10). The contact hole 36 has a hole depth D20 (e.g., about 1.3 μm) having a length that extends from the surface of the upper electrode 35 to the surface of the lower electrode 33.

A method for forming each contact hole 36 is as follows: A contact hole 36 having a hole diameter D10 and a hole depth D20, which extend from the surface of an upper electrode 35 to the surface of a lower electrode 33, is formed by dry etching (e.g., plasma etching). At this time, a hole diameter D12 of an opening 36c formed in an insulating film 42 at the bottom of the contact hole is smaller than a hole diameter D10 of an opening 36a formed in the upper electrode 35. Next, a hole diameter D11 is spread by chipping away a hole main body 36b formed in an insulating film 34 as indicated by arrows in FIG. 4 according to a wet etching condition using an etchant that a sufficient selection ratio is obtained with respect to the upper electrode 35, the lower electrode 33 and the insulating film 42 with almost no spread of both the hole diameter D10 of the opening 36a formed in the upper electrode 36 and the hole diameter D12 of the opening 36c formed in the insulating film 34.

The sensor 30A is similar to that of the first preferred embodiment in other configuration and manufacturing method.

Operation of Sensor Showing Second Preferred Embodiment

When the plasma process detecting sensor 30A is exposed to a plasma etching condition, electrons e and positive ions h identical in amount are migrated to the surface of the plasma process detecting sensor. Since, at this time, the electrons e do no enter vertically so much as compared with the positive ions h, some of the electrons e, which are migrated to the bottom of the contact hole, collide with the inner wall surface of the hole main body 36b and cannot reach the bottom of the contact hole. Therefore, the positive ions h are much deposited on the lower electrode 33. On the other hand, the electrons e are much stored on the upper electrode 35. Thus, charge polarization occurs between the upper electrode 35 and the lower electrode 33 and the degree of polarization of an electric charge with respect to the plasma etching condition (charge-up amount) is measured as a difference in potential between the electrodes by the voltage measuring device 40.

Effects of Second Preferred Embodiment

According to the sensor 30A of the present embodiment, since the hole diameter D11 of the insulating film 34 between the upper electrode 35 and the lower electrode 33 is spread, the collision of the positive ions h moved in the direction of the bottom of the contact hole with the insulating film 34 is reduced. Therefore, the inner wall surface of the hole main body of the insulating film 34 is hard to undergo damage, and the generation of a defect level is hence suppressed. Thus, it is possible to suppress age deterioration of a sensor function during the measurement of a charge-up. In this case, there is a fear of problems (1) through (3) to be described next.

(1) As the ratio of the hole diameter D12 at the bottom of the contact hole to the hole depth D20 becomes larger, the charge-up amount is small and the difference in potential to be measured is also reduced.

(2) As the ratio becomes larger, the width of change in the charge-up amount with respect to a change in the plasma etching condition is small and sensitivity to be measured is reduced.

(3) In the leading-edge 65 nm generation or later as described above, the diameter of each contact hole is φ0.1 and the aspect ratio is about 10. In order to measure a charge-up with respect to the diameter, the diameter of the contact hole in the sensor 30A and the aspect ratio should also be φ0.1 μm and about 10 respectively.

Thus, in order to avoid such problems (1) through (3) the insulating film 42 with almost no spread of the hole diameter D12 by wet etching is provided in the present embodiment. Therefore, damage to the inner wall surface of the hole main body of the insulating film 34 can be suppressed with almost no spread of the hole diameter D12 of the bottom of each contact hole (lowest bottom of contact hole due to the existence of the insulating film 42. Needless to say, since the hole diameter D12 of the insulating film 42 is not spread, the positive ions h incident in the direction of the bottom of the contact hole collide with the insulating film 42 and the insulating film 42 undergoes damage. By thinning the insulating film 42 subjected to damage (setting it to about 10 nm or so, for example), however, damage that the inner wall surface of the hole main body of the insulating film 34 between the upper electrode 35 and the lower electrode 33 undergoes (generation of defect level) can be minimized.

Preferred Modification

The present invention is not limited to the above embodiments. Various usage forms and modifications such as the changing of the configurations of the sensors 30 and 30A and their manufacturing methods to ones other than those illustrated in the figures.

While the preferred forms of the present invention have been described, it is to be understood that modifications will be apparent to those skilled in the art without departing from the spirit of the invention. The scope of the invention is to be determined solely by the following claims.

What is claimed is:

1. A plasma process detecting sensor comprising:
a substrate;
a first electrode selectively formed over the substrate in a state of being insulated from the substrate;
a first insulating film formed over the first electrode;
a second insulating film deposited over the first insulating film;
a second electrode selectively formed over a top surface of the second insulating film and exposed to a plasma during plasma etching;
a first opening formed in the second electrode;
a contact hole defined in the second insulating film and having a depth that extends from the first opening to a top surface of the first insulating film, a diameter of the contact hole on the top surface of the second insulating film being larger than the first opening;
a second opening formed in the first insulating film located below the contact hole and having a diameter smaller than the diameter of the first opening; and
a measuring device for measuring a difference in potential between the first and second electrodes during the plasma etching.

2. The plasma process detecting sensor of claim 1, wherein the first insulating film is of a thickness smaller than that of the second insulating film.

3. The plasma process detecting sensor of claim 1, wherein the first insulating film has a larger etching resistance than the second insulating film.

4. The plasma process detecting sensor of claim 1, wherein the first insulating film includes a silicon nitride film.

5. The plasma process detecting sensor of claim 1, wherein the second insulating film includes a silicon oxide film.

6. The plasma process detecting sensor of claim 1, wherein the contact hole and the first and second openings are circular in a plan view.

7. A plasma process detecting sensor, comprising:
a substrate;
a first electrode formed on the substrate and being insulated from the substrate;
a first insulating film formed on the first electrode;
a second insulating film formed on the first insulating film;

a second electrode formed on a top surface of the second insulating film;

a contact hole formed in the second electrode and the first and second insulating films, the contact hole having a first opening formed in the second electrode, a second opening formed in the first insulating film, and a main part formed in the second insulating film, the main part being of a diameter larger than that of the first opening, the second opening being of a diameter smaller than that of the first opening; and a measuring device for measuring a difference in potential between the first and second electrodes during a plasma etching.

\* \* \* \* \*